United States Patent [19]
Holmlund et al.

[11] 4,028,587
[45] June 7, 1977

[54] MARKER CIRCUIT

[75] Inventors: Gary Wayne Holmlund, Santa Rosa, Calif.; Toshio Ichino, Hino, Japan

[73] Assignee: Hewlett-Packard Company, Palo Alto, Calif.

[22] Filed: Apr. 14, 1975

[21] Appl. No.: 567,466

[30] Foreign Application Priority Data

Sept. 6, 1974  Japan .............................. 49-102570

[52] U.S. Cl. ........................... 315/377; 307/233 R; 328/134; 328/138
[51] Int. Cl.² ........................................ G01R 13/30
[58] Field of Search ....................... 307/233 R, 234; 315/377; 328/138, 140, 134

[56] References Cited
UNITED STATES PATENTS

| | | | |
|---|---|---|---|
| 3,500,369 | 3/1970 | Kellam ................................ | 307/234 |
| 3,515,996 | 6/1970 | Nixon et al. ........................ | 328/140 |
| 3,596,193 | 7/1971 | Durwoodie ......................... | 315/377 |
| 3,611,157 | 10/1971 | Hughes .............................. | 307/234 |
| 3,772,534 | 11/1973 | Dellecave et al. .................. | 307/234 |

*Primary Examiner*—Richard A. Farley
*Assistant Examiner*—Richard E. Berger
*Attorney, Agent, or Firm*—Patrick J. Barrett

[57] ABSTRACT

A circuit is provided for use with a swept frequency test system to produce a marker on the system display when the swept frequency signal reaches one or more predetermined reference frequencies. The marker circuit mixes the swept frequency signal with a reference frequency signal to produce a beat frequency signal or birdie, and a frequency detecting circuit detects when the frequency of the birdie is below a predetermined frequency. When this occurs a marker pulse is generated for use in the system display.

6 Claims, 5 Drawing Figures

MARKER CIRCUIT

BACKGROUND OF THE INVENTION

Swept frequency test systems commonly comprise a sweeping signal generator, usually known as a sweeper, which produces an output signal having a frequency that varies linearly with time between predetermined limits. The output of the sweeper is passed through a device under test and is detected by a detection circuit, such as a network analyzer, spectrum analyzer or the like. The output of the detection circuit is usually displayed on a cathode ray tube (CRT) display as a function of the frequency of the sweeper. The system thus produces a visual indication of the frequency response of the device under test.

It is usually desirable to know the frequency of certain points on the frequency response display more accurately than can be determined from the horizontal axis of the CRT display. In the past it has been common to provide frequency markers on the CRT by various means. One commonly used marker is the so-called birdie which is produced by mixing the sweeper output with a reference signal to produce a signal having a frequency equal to the difference between the frequencies of the sweeper output and the reference frequency signal. This output signal is usually passed through a low pass filter and then is applied to the vertical input of the CRT display to modulate the display and thereby give an indication which shows the point in the display at which the two signals are equal in frequency. This system has the disadvantage that the rapid undulations of the birdie in the marker are often obscured by variations in the display due to the frequency response characteristics of the device under test. Furthermore, the size of the birdie depends upon not only the bandwidth of the low pass filter but on the signal strength of the two signals combined to produce the birdie.

Various attempts have been made to produce markers by detecting amplitude changes when a birdie is produced and modulating the vertical axis of the CRT display with a pulse when the birdie is detected. This likewise has the disadvantage that the amplitude detection is dependent on the strength of the signals combined to make the birdie as well as the bandwidth of the low pass filter and thus may not produce a reliable marker under all circumstances.

SUMMARY OF THE INVENTION

According to the preferred embodiment of the present invention a mixer circuit is provided to produce a beat frequency signal or birdie. The frequency of the birdie is determined by the frequency difference between a sweeper output signal and a reference frequency signal. The birdie signal is passed through a limiting amplifier to provide a square wave signal having the same frequency as the birdie. This square wave signal drives a monostable multivibrator to produce a series of pulses having a constant width and whose leading edges coincide with the beginning of each cycle of the square wave signal. The duration of half of each cycle of the square wave signal is compared with the duration of each pulse in a frequency comparator circuit. This comparator circuit gives output signals indicating whether the period of the square wave signal is greater or less than twice the pulse duration. When the period of the square wave signal is greater than twice the pulse duration, a marker output circuit connected to the frequency detecting circuit produces an output signal during the time that the period of the square wave signal remains greater than twice the pulse duration. This output signal can be fed to a CRT display in a swept frequency test system to provide a marker on the display. The marker is most advantageously used by applying it to the Z axis input of the CRT display to modulate the intensity of the trace on the display, thus producing an intensified dot on the display screen at the point where the two signals are equal in frequency. The dot is easy to see and photograph and does not disturb the frequency response information displayed on the screen.

DESCRIPTION OF THE PREFERRED EMBODIMENT

Figure 1:
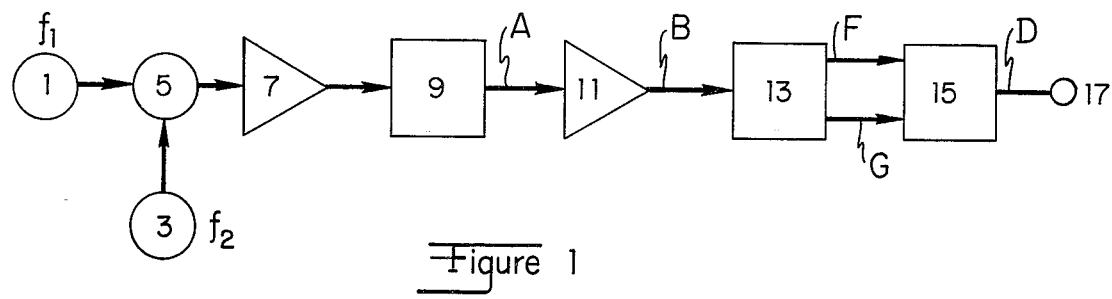
FIG. 1 shows a block diagram of the preferred embodiment of the present invention.
Figure 2:
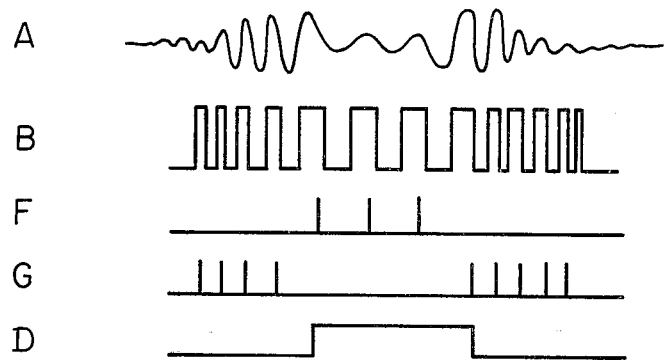
FIG. 2 shows wave forms of signals at various points in the circuitry of FIG. 1.

As shown in FIG. 1, a mixer 5 is connected to a swept frequency signal source 1 producing a signal having a varying frequency $F_1$ and to a reference frequency signal source 3 producing a signal having a frequency $F_2$. The output of mixer 5 is a signal whose frequency is equal to the difference between the output of the swept frequency signal source and the reference frequency source ($F_1 - F_2$). This beat signal or birdie is amplified by a preamplifier 7 and then is fed to a low pass filter 9 which has a bandwidth that is typically much less than either $F_1$ or $F_2$. FIG. 2A shows the output of the low pass filter. The frequency of the signal decreases as $F_1$ gets closer to $F_2$, passes through a DC value and gets greater again as $F_1$ continues to change. The amplitude of the signal shown in FIG. 2A varies as a function of the bandwidth of low pass filter 9.

The output of low pass filter 9 is amplified and limited by a limiting amplifier 11 connected to a frequency detecting circuit 13. The output signal of the limiting amplifier is a square wave or pulse signal having the same frequency as the beat signal, but having a constant, limited amplitude as shown in FIG. 2B. Frequency detecting circuit 13 has logic circuits (described more fully below) that produce output signals indicating whether the frequency of the square wave signal is greater or lesser than a predetermined frequency, as shown in FIGS. 2F and G. Frequency detecting circuit 13 is connected to a flip-flop which changes state in response to the signals from frequency detecting circuit 13, as shown in FIG. 2D. The output of flip-flop 15 thus indicates when the frequency $F_1$ is close or equal to the frequency $F_2$.

Figure 3:
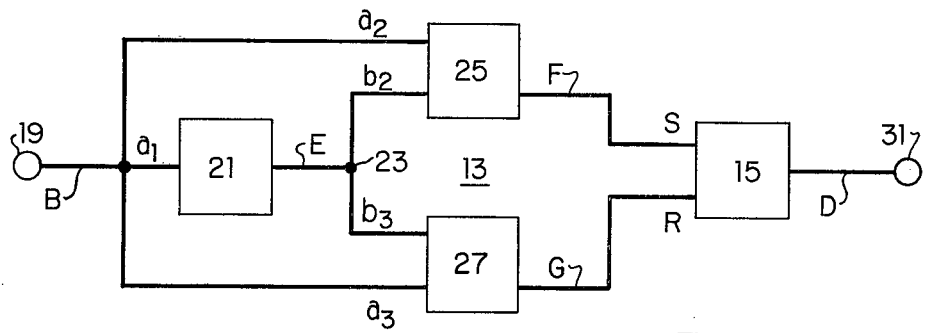
FIG. 3 shows a more detailed block diagram of a portion of the circuitry shown in FIG. 1.
Figure 4:
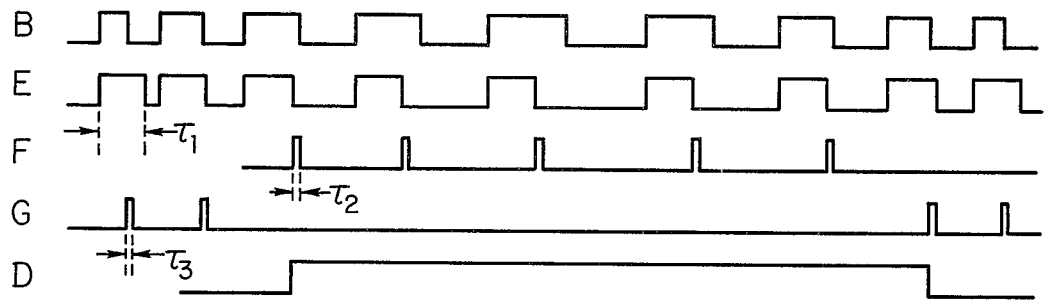
FIG. 4 shows wave forms of signals at various points in the circuitry of FIG. 3.

FIG. 3 shows a more detailed diagram of the frequency detecting circuit 13 and FIG. 4 shows wave forms at various points in that circuit. Input 19 receives square wave signals from limiting amplifier 11 and inputs $A_1$, $A_2$ and $A_3$ of monostable multivibrators 21, 25 and 27 respectively are connected to input 19. Monostable multivibrator 21 produces pulses shown in FIG. 4E that have a constant pulse width $\tau_1$ and have a leading edge which corresponds with the leading edge of each cycle of the square wave shown in FIG. 4B. Monostable multivibrator 25 produces pulses shown in FIG. 4F having a pulse width $\tau_2$, and monostable multivibrator 27 produces pulses shown in FIG. 4G having a pulse width $\tau_3$.

The output pulses from monostable multivibrator 25 are triggered by the trailing or negative going edge of the pulse from monostable multivibrator 21 if the square wave is high at the same time. Thus the pulses shown in FIG. 4F will be produced only when the period of the square wave is greater than twice the duration of the pulse shown in FIG. 4E. This means that the frequency of the beat signal is lower than the frequency determined by twice the duration of the pulses from the monostable multivibrator 21. Pulses from monostable multivibrator 27 are triggered by the negative going or trailing edge of the square wave shown in FIG. 4B if the pulse from monostable multivibrator 21 is high as shown in FIG. 4G. This means that the pulse from monostable multivibrator 27 is produced only when the square wave has a period less than twice the duration of the pulse from monostable multivibrator 21. Pulses from monostable multivibrator 25 set flip-flop 15 to produce an output signal on terminal 31 that is high as shown in FIG. 4D when the beat signal frequency is below the predetermined threshold. Pulses from monostable multivibrator 27 reset flip-flop 15 so that the output signal on terminal 31 is low when the frequency of the beat signal is above the predetermined threshold frequency.

Figure 5:
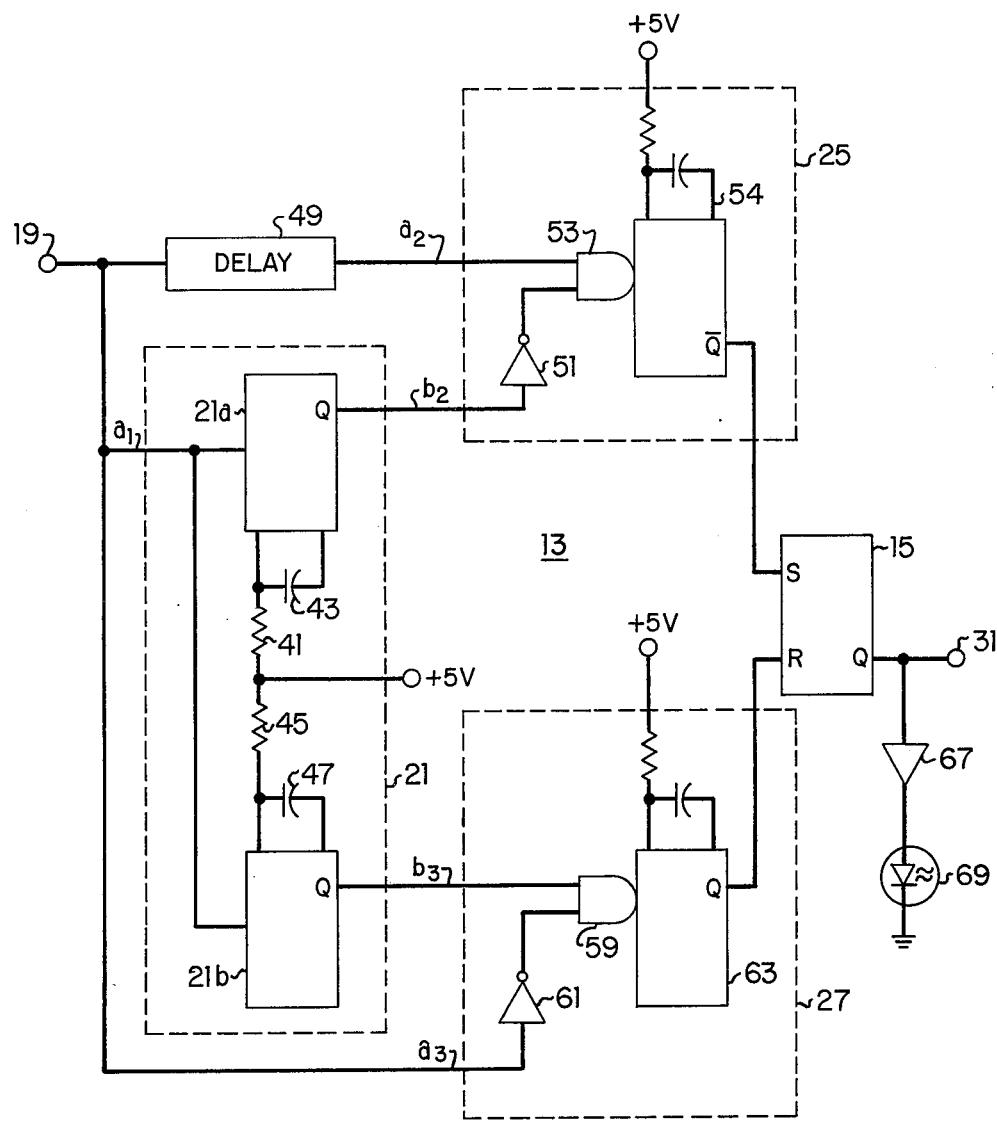
FIG. 5 shows a more detailed schematic diagram of the circuitry shown in FIG. 3.

FIG. 5 shows a more detailed schematic diagram of the circuitry shown in FIG. 3. In order to prevent race conditions from occurring in flip-flop 15, monostable multivibrator 21 preferably comprises two monostable multivibrators 21A and 21B. The "on" time of monostable multivibrator 21A is determined by resistor 41 and capacitor 43. Similarly, the on time of monostable multivibrator 21B is determined by resistor 45 and capacitor 47. These timing components determine a pulse width $\tau_1$ which is slightly different for each of the two monostable multivibrators 21A and 21B. By choosing these pulse widths to be slightly different, one half the period of the square wave will not be equal to both pulse widths at the same time and thus there will be no race condition in flip-flop 15.

The square wave from input 19 passes through a delay 49 which compensates for path length differences between monostable multivibrators 25 and 27 and input 19. The output of monostable multivibrator 21A is inverted in an inverter 51 which is connected to an AND gate 53 which comprises part of monostable multivibrator 25. The inverted pulses from monostable multivibrator 21A is compared with the square wave on input $A_2$ in the Schmitt trigger 54 which gives a high output signal on $\overline{Q}$ when the pulse signal on $B_2$ is low and the square wave signal goes low. This signal from monostable multivibrator 25 sets flip-flop 15 to give a high output on terminal 31 as shown in FIG. 4D.

Likewise, monostable multivibrator 27 comprises an AND gate 59 connected to receive a signal from inverter 61 which in turn receives the square wave signal from input 19. AND gate 59 also receives the pulse signal from monostable multivibrator 21B. AND gate 59 is connected to Schmitt trigger 63 and output Q of this Schmitt trigger is connected to the reset input of flip-flop 15 to reset the flip-flop when the pulse from monostable multivibrator 21 is high and the square wave is low.

The output of flip-flop 15 is also connected to a driver amplifier 67 which in turn is connected to a light emitting diode 69. The output signal from flip-flop 15 turns on light emitting diode 69 so that it emits the light during the duration of the marker pulse shown in FIG. 4D.

We claim:

1. A circuit for generating a marker signal comprising:
    a first input circuit for receiving a first signal;
    a second input circuit for receiving a second signal;
    mixing means connected to the first and second input circuit for producing a beat signal having a frequency equal to the difference between the frequencies of the first and second signals;
    frequency detecting means connected to the mixing means for detecting when the frequency of the beat signal is below a predetermined threshold frequency and for producing output signals indicating whether the beat signal frequency is above or below the predetermined threshold frequency, the frequency detecting means comprising a pulse generator connected to the mixing means for producing a pulse having a duration equal to one half the period of the threshold frequency, and comparator means connected to the mixing means and the pulse generator for comparing the period of the beat signal with the duration of the pulse and for producing a first output signal when the period of the beat signal is less than twice the duration of the pulse and a second output signal when the period of the beat signal is more than twice the duration of the pulse; and
    output means connected to the frequency detecting means for producing an output marker signal in response to receipt of the first output signal but not in response to receipt of the second output signal.

2. A circuit as in claim 1 further comprising signal shaping means connected between the mixing means and the frequency detecting means for producing a square wave signal having a frequency equal to the beat signal.

3. A circuit as in claim 2 wherein:
    the signal shaping means comprises a limiting amplifier;
    the pulse generator comprises a first monostable multivibrator for producing the pulse in response to the square wave signal changing from a first level to a second level;
    the comparator means comprises a second monostable multivibrator connected to receive signals from the limiting amplifier and the first monostable multivibrator for producing the first output signal when the square wave signal changes from the second level to the first level after completion of the duration of the pulse, and a third monostable multivibrator connected to receive signals from the limiting amplifier and the first monostable multivibrator for producing the second output signal when the square wave signal changes from the second level to the first level before completion of the duration of the pulse; and
    the output means comprises a flip-flop connected to receive the first and second output signals from the second and third monostable multivibrators.

4. A circuit as in claim 3 wherein the first signal is a swept frequency signal and the second electromagnetic signal is a signal having a reference frequency.

5. A circuit as in claim 4 wherein the second signal has a plurality of regularly spaced frequencies.

6. A circuit as in claim 1 further comprising a visual annunciator connected to the frequency detecting means for providing a visual indication of the output marker signal.

* * * * *